(12) United States Patent
Dirks et al.

(10) Patent No.: US 8,067,830 B2
(45) Date of Patent: Nov. 29, 2011

(54) DUAL OR MULTIPLE ROW PACKAGE

(75) Inventors: Peter Dirks, Valkenswaard (NL); Dirk Groeneveld, Elst (NL)

(73) Assignee: NXP B.V., Eindhoven (NL)

( * ) Notice: Subject to any disclaimer, the term of this patent is extended or adjusted under 35 U.S.C. 154(b) by 270 days.

(21) Appl. No.: 12/525,265

(22) PCT Filed: Feb. 11, 2008

(86) PCT No.: PCT/IB2008/050478
§ 371 (c)(1),
(2), (4) Date: Jul. 30, 2009

(87) PCT Pub. No.: WO2008/099321
PCT Pub. Date: Aug. 21, 2008

(65) Prior Publication Data
US 2010/0084756 A1 Apr. 8, 2010

(30) Foreign Application Priority Data
Feb. 14, 2007 (EP) .................................. 07003118

(51) Int. Cl.
*H01L 23/48* (2006.01)
*H01L 23/58* (2006.01)
(52) U.S. Cl. .......... 257/690; 257/48; 257/734; 257/786; 257/E23.01; 257/E23.178; 257/E21.499
(58) Field of Classification Search .................. 257/690, 257/734, 773, 776, 782, E23.01, E23.178, 257/E21.499, 666, 786, 48, 737, 738, 778, 257/E23.141
See application file for complete search history.

(56) References Cited

U.S. PATENT DOCUMENTS

| 5,818,114 | A | 10/1998 | Pendse et al. |
| 5,962,926 | A | 10/1999 | Torres et al. |
| 6,683,368 | B1 | 1/2004 | Mostafazadeh |
| 7,755,083 | B2 * | 7/2010 | Lin ................................. 257/48 |
| 7,868,439 | B2 * | 1/2011 | Chang et al. .................. 257/686 |
| 2002/0109227 | A1 | 8/2002 | Liu et al. |
| 2005/0189627 | A1 | 9/2005 | Ito et al. |
| 2009/0174051 | A1 * | 7/2009 | Osaka et al. .................. 257/686 |

FOREIGN PATENT DOCUMENTS

| DE | 102 31 647 A1 | 10/2003 |
| EP | 0 446 868 A | 9/1991 |
| JP | 06 061363 A | 3/1994 |
| WO | 03085728 A1 | 10/2003 |
| WO | 2004057668 A1 | 8/2004 |

* cited by examiner

*Primary Examiner* — Jasmine Clark (57) ABSTRACT

A dual or multiple row package (300) is provided which comprises a first plurality of terminals (303, 304, 305) and a second plurality of terminals (306, 307), which first and second plurality of terminals are exposed outside the encapsulation at a first side of the package. The terminals of the first plurality of terminals (303, 304, 305) are arranged in a first row (301), wherein a distance between each pair of adjacent terminals in the first row (301) is greater or equal than a first threshold value. Furthermore, the terminals of the second plurality of terminals (306, 307) are arranged in a second row (302), wherein a distance between each pair of adjacent terminals in the second row (302) is greater or equal than a second threshold and a distance between the first row (301) and the second row (302) is smaller than at least the first threshold value.

19 Claims, 8 Drawing Sheets

DUAL OR MULTIPLE ROW PACKAGE

FIELD OF THE INVENTION

The invention relates to a dual or multiple row package. Moreover, the invention relates to a method of soldering such a package.

BACKGROUND OF THE INVENTION

One of the major trends in the semiconductor packaging industry is to use surface-mount technology (SMT) as a replacement for conventional plated-through-hole (PTH) technology. SMT offers several distinct advantages over PTH technology, such as greater packaging density, higher lead counts with shorter interconnection lengths and easier automation. Since SMT requires electronic devices and components to be mountable on the surface of a printing wiring board, the materials and structure of traditional leaded components including capacitors, resistors and inductors have to be redesigned to meet the modern-day demand for short, thin, light and small electronic devices.

Examples of semiconductor devices accomplishing these objects include "quad flat non-leaded (QFN)" packages. Quad flat non-leaded electronic devices have a relatively new package structure, in which space-consuming outer leads protruding laterally out of a package are eliminated. Instead, external electrode pads to be electrically connected to a motherboard are provided on the backside of the QFN package.

A quad flat non-leaded package, especially a leadless leadframe package (LLP) makes use of a metal leadframe-type substrate structure in the formation of a chip scale package (CSP). In a typical leadless leadframe package, a copper leadframe strip or panel is patterned by stamping or etching to define a plurality of arrays of chip substrate features. Each chip substrate feature includes a die attach pad and a plurality of contacts (bonds) disposed about their associated die attach pad. During assembly, dice are attached to the respective die attach pads and conventional wire bonding is used to electrically couple each die to their associated bond pad contacts on the leadframe strip. After the wire bonding process, a synthetic resin cap is moulded over the top surface of each array of wire-bonded dice. The dice are then singulated and tested using conventional sawing and testing techniques.

Figure 5:
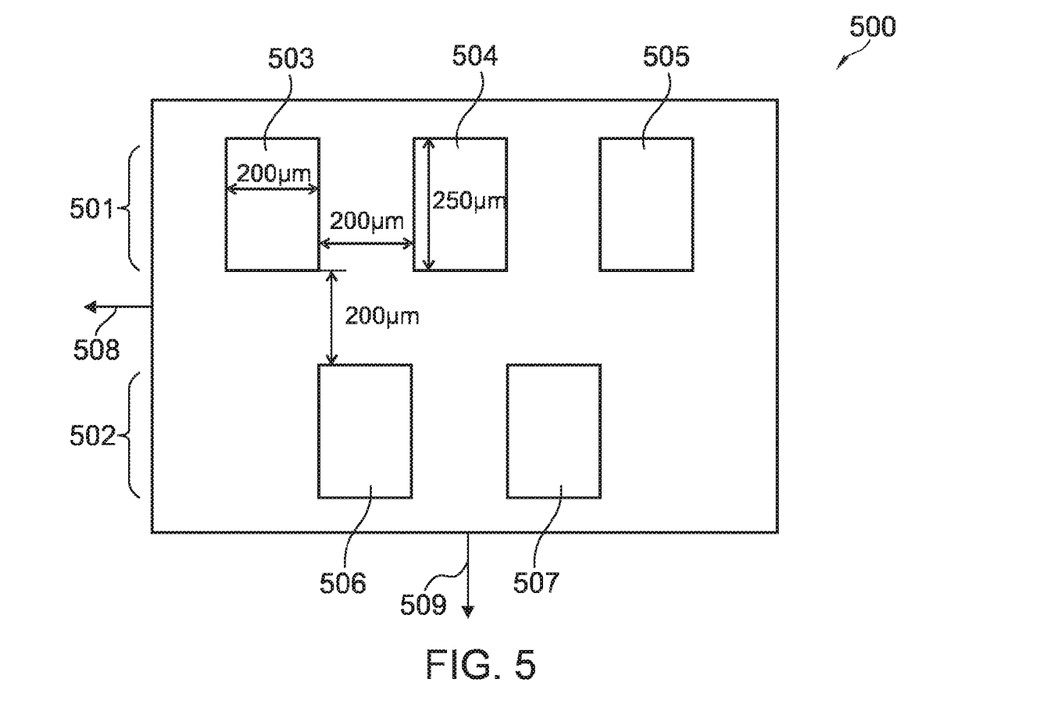
FIG. 5 shows a prior art package in a view similar to that of FIG. 3.

In the following, referring to FIG. 5, a conventional dual row package 500 having equal spacing will be shortly explained. The conventional dual row package 500 comprises a first row 501 of terminals and a second row of terminals 502. Each of the rows comprises a plurality of terminals, which are schematically depicted as rectangular terminals 503, 504 and 505 for the first row 501 and as rectangular terminals 506 and 507 of the second row 502. Furthermore, a first arrow 508 shows a longitudinal axis of the dual row package 500 and a perpendicular direction showing towards a center of the dual row package 500 is shown by a second arrow 509. Thus, the second row 502 may form an inner row of the package. Such a conventional dual row package 500 has a spacing between the terminals of one row, i.e. in the first direction 508, the so-called pad-pitch of about 200 μm, for example. By the same time the spacing between the two rows, i.e. in the second direction 509, the so-called row-pitch is also about 200 μm. That is, the pad-pitch and the row-pitch is the same in the conventional dual row package 500.

The resulting packaged chip can then be surface mounted on a printed circuit board or other substrate using conventional techniques. Solder is printed well in a rectangular shape, suitably using stencil soldering. However, under reflow (heat) conditions the solder adheres to a ball and may generate shorts between adjacent pads. Thus, in order to reduce the probability of shorts, large distances between the terminals are used to be able to solder the components without opens and without shorts. However, to provide a given (desired) number of pads, larger distance between pads will result in a relatively large amount of space needed for the total package, which is a drawback in use for nowadays and future short, thin, light and small electronic devices.

OBJECT AND SUMMARY OF THE INVENTION

It is an object of the invention to provide a dual or multiple row package of the kind mentioned in the opening paragraph which allows a high density of terminals and which can be soldered to a printed circuit board without the formation of solder bridges.

In order to achieve the object defined above, a package and a method of soldering the package according to the independent claims are provided.

According to a further aspect of the invention, a package is provided with test pads defined between the (outer) row of terminals and a die pad terminal. Such pads allow testing in an effective manner, but need not to be connected to corresponding pads in the printed circuit boards. As a result, the package may also be used in combination with printed circuit board that do not have the features of vias inside the board.

According to an exemplary embodiment of the invention, a package is provided which comprises a first plurality of terminals and a second plurality of terminals, which first and second plurality of terminals are exposed outside the encapsulation at a first side of the package. The terminals of the first plurality of pads are arranged in a first row. A distance between each pair of adjacent pads in the first row is greater or equal than a first threshold value. Furthermore, the terminals of the second plurality of pads are arranged in a second row, wherein a distance between each pair of adjacent pads in the second row is greater or equal than a second threshold and a distance between the first row and the second row is smaller than at least the first threshold value. In particular, the distance between the first row and the second row is also smaller than at least the second threshold value. Of course a greater number than two rows is possible, but at least two rows are formed wherein the two rows have a distance from each other that is greater than the distance between each pair of terminals of at least one row.

It may be seen as a gist of an exemplary embodiment that the spacing of the terminals in one single row is greater than the spacing of the rows relative to each other. Such an arrangement or spacing has been found to reduce the risk that solder bridges are formed during the reflow soldering process. It was experimentally found that such solder bridges primarily occur between pads of one row and are less probable between pads relating to different rows. Thus, it may be possible to reduce the area necessary to provide a given number of pads by reducing the spacing between rows of pads. Reducing the necessary area, that is the necessary surface, may enable to produce less expensive packages.

The package of the invention is particularly suitable, in case that the terminals are defined at a stand-off distance from the surface of the encapsulation. Such a definition of terminals is for instance achieved by use of the technology disclosed in WO2003/85728. The technology described herein, to which also will be referred to as UTLP technology, allows the independent patterning of two mutually connected metal layers. In other words, the terminals may be defined with a slightly different pattern than contact pads connected thereto.

Further features may be defined adjacent to the contact pads that are partially or completely without a corresponding terminal. Since the contact pads mechanically connect the terminals to the package, it is particularly advantageous that contact pads corresponding to the terminals are mechanically anchored in the encapsulation.

Suitably, the terminals of the first row are staggered with respect to the terminals of the second row. In particular, the first row comprises spaces between each pair of adjacent terminals, and the terminals of the second row are arranged in these spaces but shifted perpendicular to the extension of the first row. In other words a chessboard like structure may be formed in which the terminals may correspond to the black fields while the spaces may correspond to the white fields. However, a shifting between the arrangement of the terminals in the two rows does not be necessarily correspond to the spacing of the terminals in the rows, i.e. no real chessboard like arrangement has to be formed. In particular, an empty area between two adjacent terminals of one row may be greater or smaller than the width of the corresponding terminals, so that no real chessboard like pattern is possible. However a staggered pattern may be still possible.

Such a staggered arrangement may be in particular advantageous in case each single contact pad coupled to a terminal has to be contacted by a wire, since in such an arrangement, the wires used for contacting the pads of the first row and the wires used for contacting the pads of the second row may less interfere with each other.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

The Figures are not drawn to scale and are purely diagrammatical. Equal reference numerals in different functions refer to corresponding parts in the device.

Figure 1:
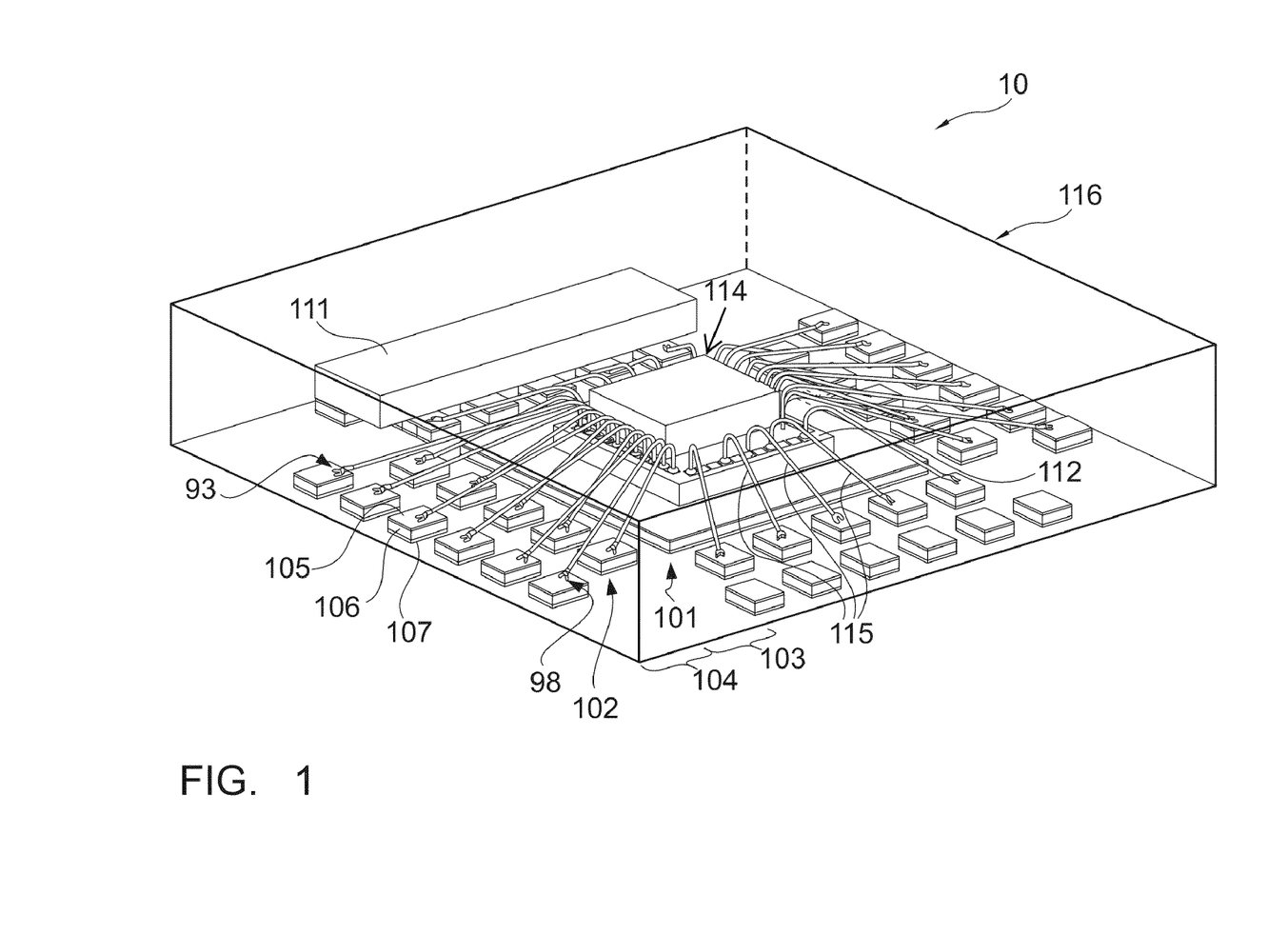
FIG. 1 shows in cross-sectional view a first embodiment of the package of the invention.

FIG. 1 is a perspective view of a first embodiment of a semiconductor chip package 10. In this example, the package 10 comprises a die pad 101, to which a chip 114 is attached with its second side 12. Suitably, use is made of a die attach for the attachment of chip 114 and die pad 112. It is however not excluded that use is made of a solder material. The adhesive may be applied on the second side of the chip. This can be done on wafer level, for which commercially available adhesives known as wafer back coatings and wafer back laminates are available. Alternatively, the adhesive may be provided to the die pad 101 in advance of the attachment of the chip, for example with a printing technique. It is thereto an advantage that the die pad is provided with a protrusion (not shown), particularly located at an edge of the die pad 101. This protrusion is preferably ring-shaped so that it prevents the flow of adhesive outside the die pad 101. The adhesive would contaminate other features and generate uncontrollable effects when flowing outside the die pad 101. The primary function of the protrusion is its use as a down-bond area. Such a down-bond is generally used for ground contacts. A first ring-shaped outer row 104 and a second ring-shaped inner row 103 of contact pads are defined around the die pad 101.

Figure 2A:
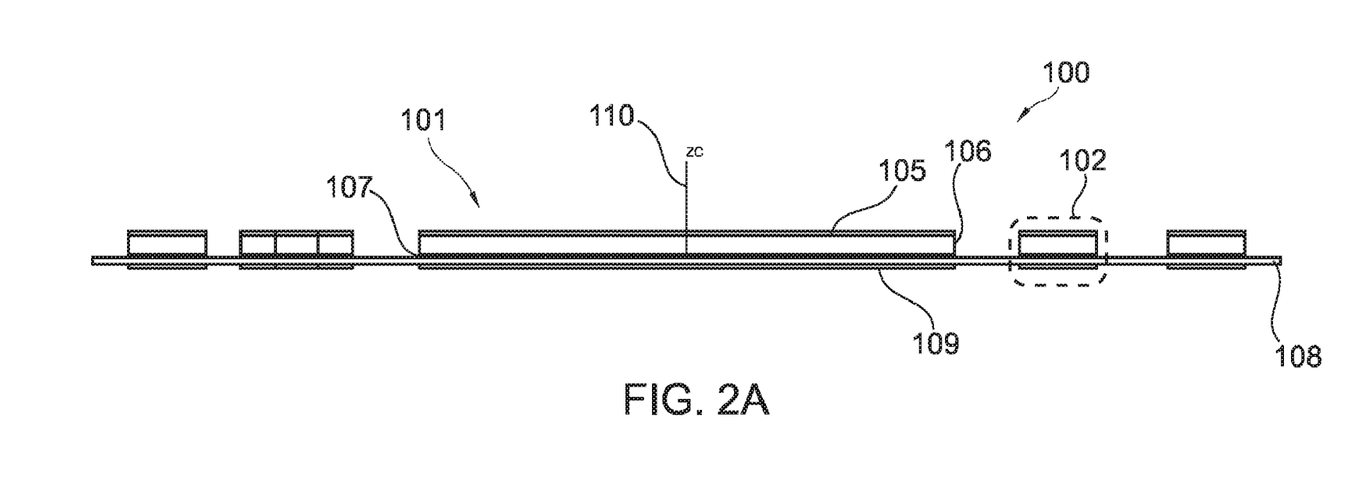
FIG. 2A-G show different steps in the manufacturing of the package of FIG. 1.
Figure 2B:
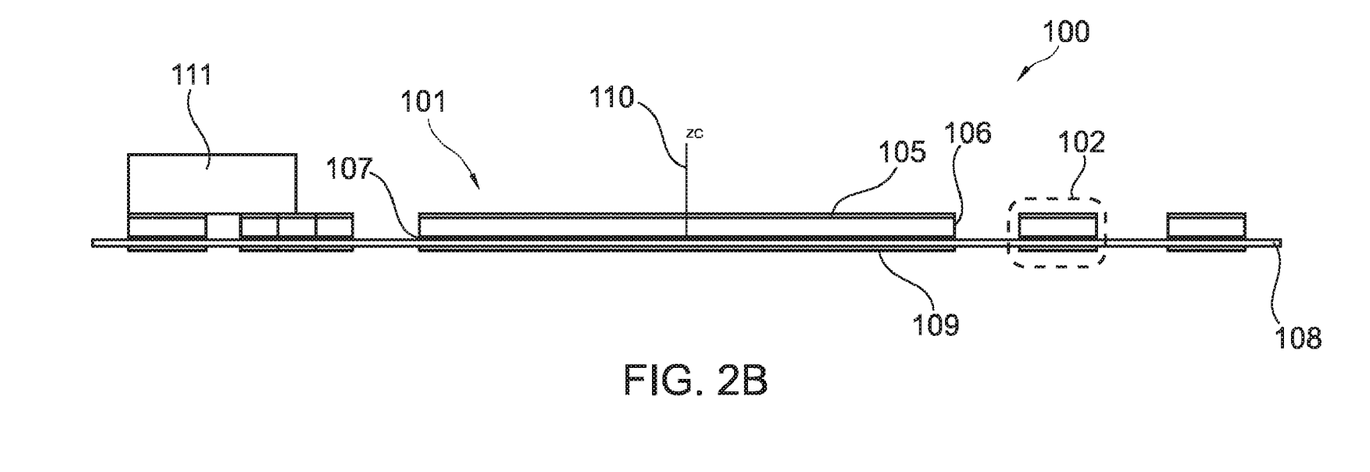
Figure 2C:
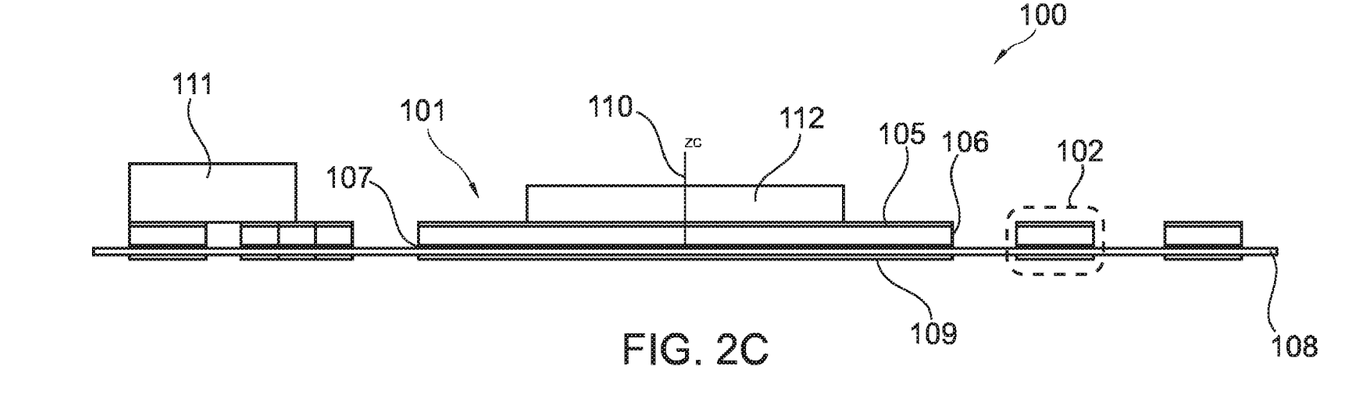
Figure 2D:
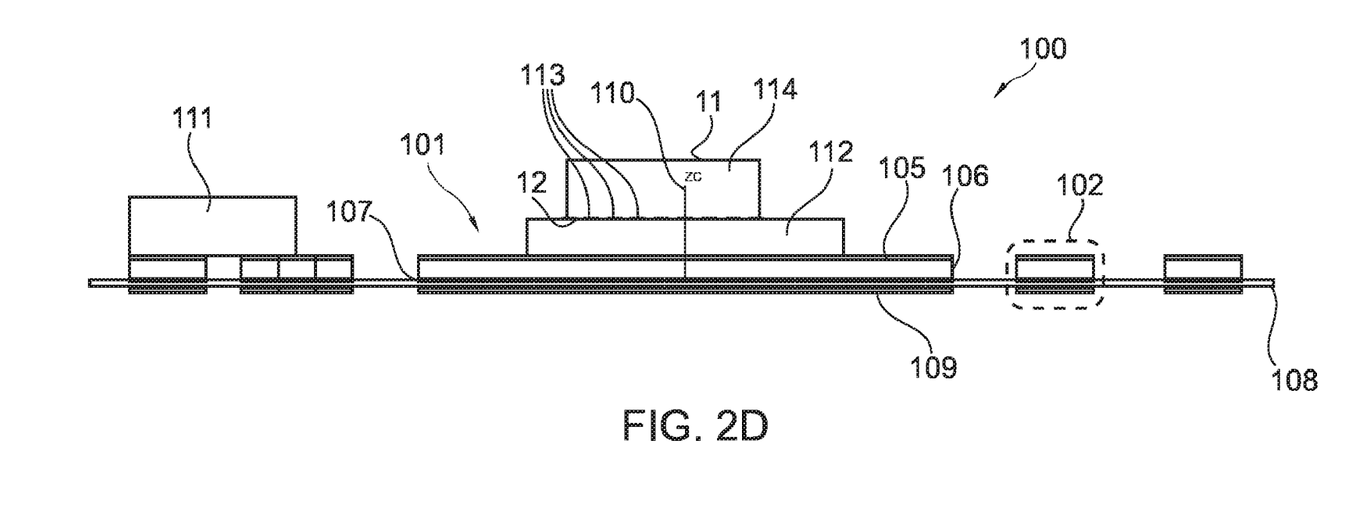
Figure 2E:
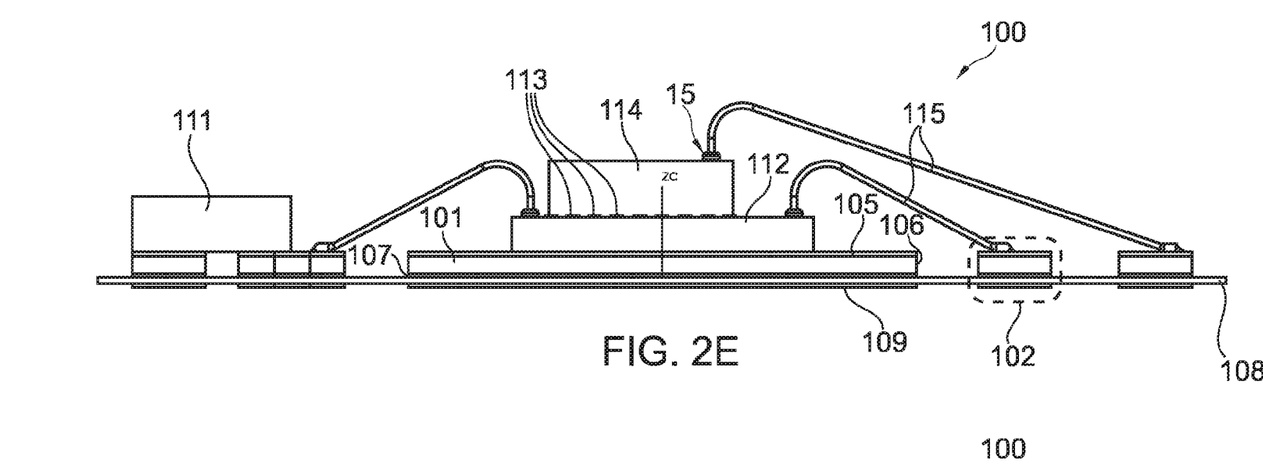

The chip 114 further comprises a first side 11 (opposite to the second side 12) and bond pads 15 on the first side 11 as shown in particular in FIG. 2E. Connections between the bond pads 15 on the first side 11 of the chip 114 and the contact pads 93-98 in the first (outer) row 104 and in the second (inner) row 103 are provided in this example with wirebonds 115. Any type of wirebonds 115 may be applied. In case a very thin package is desired, ball-stitch type wirebonds are suitably applied, with the ball bond on the contact pad 93-98 and the stitch bond on the bond pad 15. In case of a large power or high voltage connection, it may be suitable to provide more than a single wirebond 115 between two corresponding pads. Additionally, one contact pad 103-107 may be coupled with several bond pads 15 using several wirebonds. Instead of wirebonds 115, use may be made of other techniques, such as TAB-connections (Tape Automated Bonding), metal clips, etc. It is even not excluded that an additional chip or carrier is present. The connections between the chip 114 and such a carrier and between such a carrier and the contact pads 93-98 are then made with solder bumps. Such a construction is known per se from document WO2004/057668A1 "Electronic device and method of manufacturing same", the disclosure of which is herewith incorporated by reference.

An encapsulation 116 is defined partially around the contact pads and around the chip 114. Materials for creating encapsulations 116 are well-known in the art. Examples are glass filled epoxies, transparent epoxies, polyimides, etcetera. A surface of the contact pads 93-98 is exposed outside the encapsulation 116 to constitute terminals. These terminals are defined in a plane at a distance from the encapsulation 116. This location is a result of the manufacturing method of the chip package 10.

In the following, referring to FIGS. 2A to G, the process for manufacturing a semiconductor chip package of FIG. 1 is further described. In particular, FIG. 2A to G are showing cross-sectional views of the perspective view of FIG. 1.

FIG. 2A shows a cross-sectional view of the carrier 100 of FIG. 1 and in particular shows a die pad 101 and a plurality of contact pads 102. Furthermore, the multi-layered structure can be more clearly seen in FIG. 2A than in FIG. 1. In particular, a surface layer 109, a first second layer 108, the buffer layer 107, the a first conductive layer 106, and the adhesive layer 105 are shown in FIG. 2A. In addition, the z-direction ZC 100 is indicated in FIG. 2A.

FIG. 2B shows a cross-sectional view of the carrier 100 of FIG. 1. In particular, a conductor 111 is attached to one row of the inner ring 103. Instead of conductor 111 a passive component such as a discrete capacitor, resistor or inductor, or a diode, a light-emitting diode, another discrete semiconductor device or another integrated circuit may be applied.

FIG. 2C shows a cross-sectional view of the carrier 100 of FIG. 1. In particular, the intermediate pad 112 is bonded to the surface layer of the die pad 101.

FIG. 2D shows a cross-sectional view of the carrier 100 of FIG. 1. In particular, the semiconductor chip 114 is bonded to the intermediate pad 112.

FIG. 2E shows a cross-sectional view of the carrier 100 of FIG. 1. In particular, a plurality of bonding wires 115 are attached to electrically connect some of the contacts elements 113 and some of the contact pads 102 of the carrier.

Figure 2F:
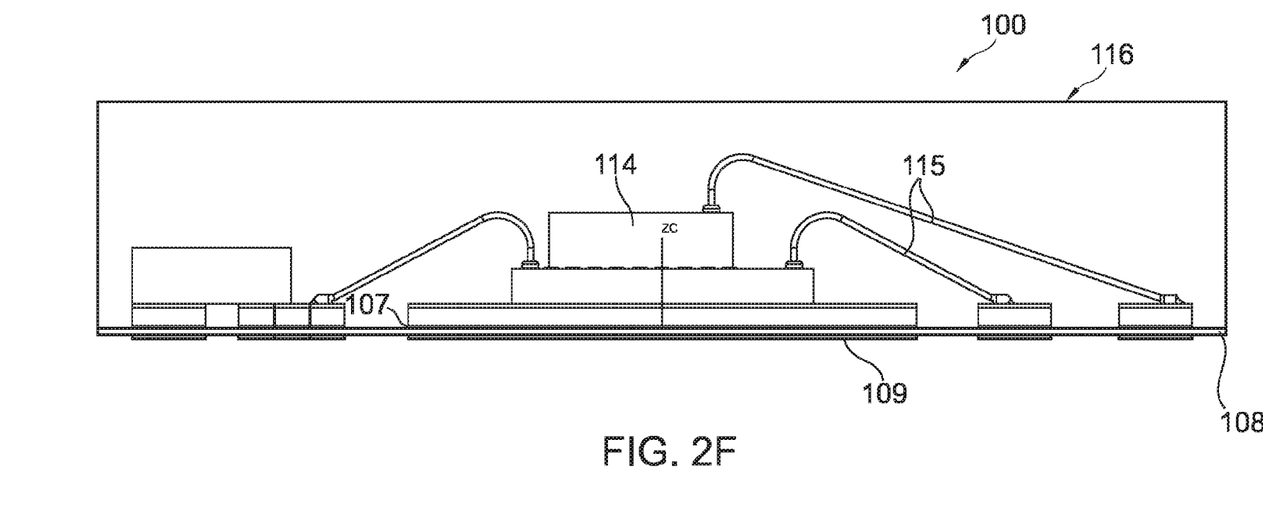

FIG. 2F shows a perspective view of the carrier 100 of FIG. 1. In particular, the encapsulation 116 is applied to the carrier 100, which encapsulation encloses the upper part of the carrier 100, i.e. the contact pads 102, the intermediate pad 112, the semiconductor chip 114 and the bonding wires 115. However, FIG. 2F clearly shows that the encapsulation 116 does not enclose the second conductive layer 108 and the surface layer 109, which are arranged on the underside of the carrier 100 (i.e. bottom side of the representation in FIG. 2).

Figure 2G:
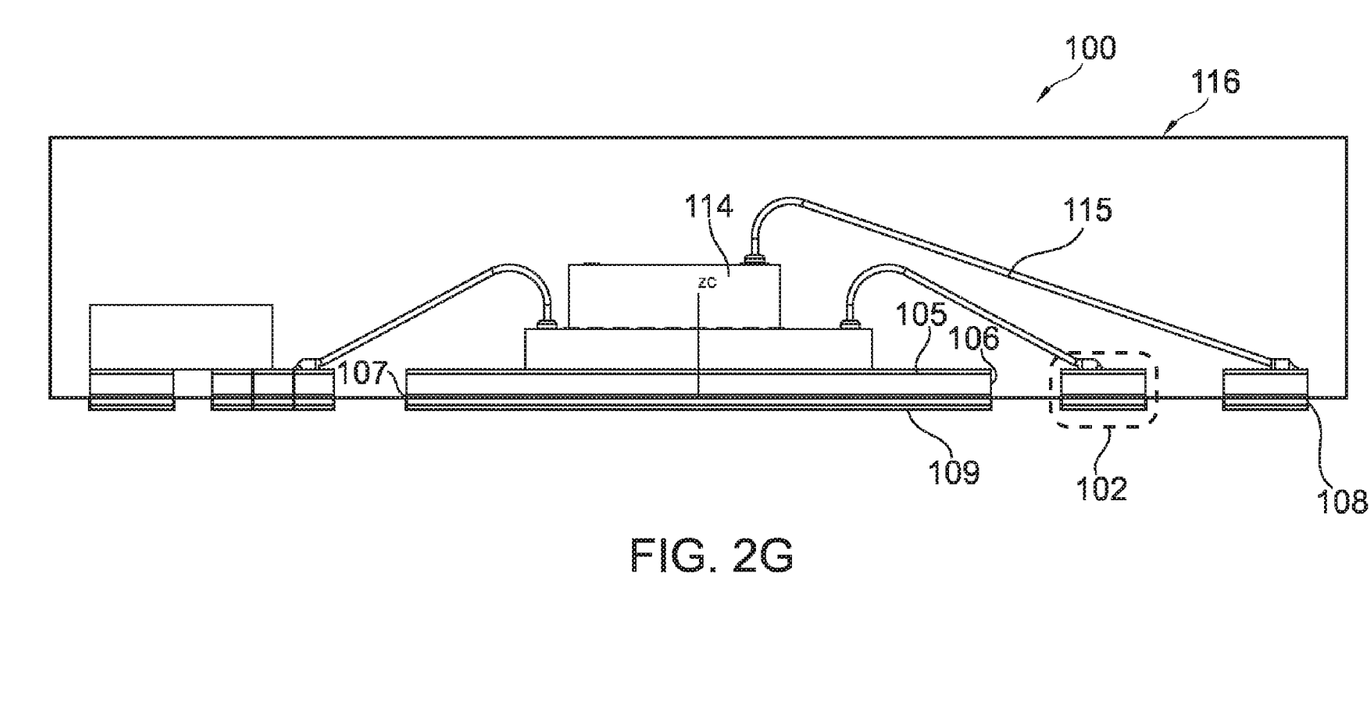

FIG. 2G shows a cross-sectional view of the carrier 100 of FIG. 1. In particular, the underside of the carrier 100 is structured, i.e. more specific, the second conductive layer 108 and the buffer layer 107 are structured in order to provide terminals that may be used to contact the encapsulated semiconductor chip 114.

The manufacturing of such a package will now be explained in more detail and additionally several options are explained as well.

The manufacturing method starts with a carrier 100, as shown in FIG. 2a. This carrier has a first side and a second side and it comprises a first metal layer 106, a second metal layer 108 and a barrier layer 107 that is sandwiched between the first metal layer 106 and the second metal layer 108. A first etch mask 105 is defined on the first metal layer 106 at the first side of the carrier 100. A second etch mask 109 is defined on the second metal layer 108 at the second side of the carrier 100. The first and the second metal layer 106, 108 preferably comprise copper, or alternatively a copper alloy. The barrier layer 107 comprises a material that can be etched selectively with respect to the material(s) of the first and the second metal layers 106, 108. Suitable choices include molybdene, nickel, iron-nickel, steel, titanium, aluminum as well as any alloys therewith. The first and second etch masks 105, 109, respectively, define patterns of the first and second metal layers 106, 108 respectively. Suitably, the masks comprise a material or a stack of materials so as to enable a proper adhesion of solder. Examples include NiAu, NiPd, NiPdAu.

Patterning the first and the second metal layers 106, 108 by means of etching turns out advantageous. First, the etching results in contact pads 93-98 and other features with sloped sidewalls and in which the first etch mask 105 extends laterally outside the first metal layer 106. This turns out to work suitable for an adequate mechanical anchoring of the pads 93-98 into the encapsulation 116. Secondly, independent patterning of the first and the second metal layer 106, 108 is possible, allowing a large freedom in the design of patterns within the carrier 100.

One specific advantage of such design freedom is the ability to define features in the first metal layer 106 and the barrier layer 107 only. This definition results therein that such features do not extend outside the encapsulation 116. If desired, they may be hidden completely in the package 100 by application of an additional insulating layer on the second side after patterning of the second metal layer 108. Moreover, such features do not have a surface with a solder adhesion layer, e.g. the second etch mask 109. Therefore, when applying solder on the terminals of the package, the features in the first metal layer 106 will not become covered or wetted with solder. It turns out advantageous for many applications to define features such as interconnects and/or coil configurations into the first metal layer 106.

Another advantage of such design freedom is that the contact pad has in its first metal layer 106 another shape and/or size as in the second metal layer 108. Particularly, while it is necessary to keep the terminals in a standardized pattern, the contact pad in the first metal layer may get a shape and position that is optimal for the wirebonding. For instance, while the terminals are defined in a rectangular pattern with a corner terminals, the first metal layer part of the contact pads may be defined in a circular, oval or octogonal ring. This provides a better accessibility of the contact pad that is connected to said corner terminal. In fact, there will not be one specific corner contact pad anymore in the first metal layer 106. For reasons of clarity, we will refer in the following to the features defined in the second metal layer 108 as the terminals, and to the corresponding features in the first metal layer 106 as contact pads 93-98.

In order to improve accessibility for wirebonding further or alternatively, one may define additional pads in the first layer 106. Such additional pads typically will be located between the contact pads in the second row 103 and the die pad 101 and are for use as wirebond islands. This additional pad allows replacement of a long wirebond 115 by two shorter wirebonds, each of them having another orientation. Such additional pad is particularly suitable for packages in which the density of pads is high and the pitch is small, and wherein there are at least two rows of contact pads. One may think here of pitches of 200 microns or less. The distance between neighboring pads is then in the order of 100 microns. Such a distance is rather small for the definition of a conductor track in between of the neighboring pads. Such a conductor track would be used to connect a contact pad in the outer, first row 104. A direct wirebond from a bond pad 15 of the chip 114 to such contact pad in the outer, first row 104 is not desired either, due to the overlap with contact pads in the inner row 103. An intermediate pad however brings a solution. Such an intermediate pad may also be embodied as a power pad. Such a power pad is defined adjacent to the die pad to allow the provision of multiple wirebonds from the chip to the power pad that is on a properly defined voltage. The power pad may be coupled to ground or to a supply voltage. It may have a terminal, which is then suitably defined in the second row 103. In case it is a grounding pad, it may be connected to the die pad 101 without any further terminal of its own.

It is understood that such an intermediate pad is also an appropriate solution for the packaging of chips that are made in advanced technology. Reference is made here in particular to integrated circuits having channel lengths of 90 nm, 65 nm or less. Such chips often have a very high density of bond pads 15. The intermediate pads may further be useful when there is a need to provide a specific connection. For power applications, it creates an opportunity to provide an additional connection between a contact pad and the chip. For RF applications, bond wires allow the tuning of the impedance between a terminal 103-104 and the chip 114.

FIG. 2b shows the carrier 100 after patterning of the first metal layer 106 and the barrier layer 107 through the first etch mask 105. Suitably, the first metal layer 106 has a thickness between 10 and 50 micrometers, while the barrier layer 107 will have a thickness between 0.5 and 10 micrometers. A larger thickness of the barrier layer 107 is however not excluded. This FIG. 2b further shows the attachment of the chip 114 with its second side to the die pad 101. This die pad 101 is defined only in the second metal layer 108. This enables a reduction of the package height.

FIG. 2c shows the package 100 in a next step. Herein, electrical connection of bond pads 15 on the first side 11 of the chip 114 to the contact pads 93-98 is provided with wirebonds 115. Additionally, the encapsulation 116 is provided. The encapsulation takes over the function to maintain mechanical integrity. It is thus possible to pattern the second metal layer 108 by etching through the second etch mask 109. Suitably, use is made of wet-etching. This has the result that there is a minimum feature size for the contact pads in the second metal layer 108, which is dependent on the thickness of the second metal layer 108. In other words, if the smallest feature is in the order of 30 micrometer, the thickness cannot be in the order of 70 micrometers, as there will be a risk that the feature is etched away completely. It also implies that with a thickness of 10 micrometers, small features with a width in the order of 10 micrometers can be defined. Usually, this is not needed in view of resolutions currently in use in printed circuit boards.

The resulting package may then be electrically connected to a printed circuit board, or alternatively to another carrier, including even another package. Although the use of electrically conductive adhesive is an option, the use of solder is preferred. One method of soldering is the application of solder balls; another method is stencil soldering. Both methods are known per se to the skilled person. In stencil printing a mask of solder resist is provided on the carrier, so as to limit the flow of solder. The solder is thereafter applied through a stencil in order to control the thickness of the solder. The solder will flow into cavities in the solder resist. The solder is then heated so as to liquefy the solder and make the electrical connection.

A common problem with stencil soldering is that solder bridges are formed between neighboring terminals. This means that a short circuit will be formed, leading to malfunctioning of the chip. This problem is known from QFN packages. A conventional solution is for instance the provision of solder on selected areas of the die pad only, by defining a grid with the solder mask on the carrier. A further conventional solution is the reduction of the width of the pads on the carrier opposite the terminals. This width reduction enables that a line of solder resist is provided between individual pads, and hence again that the size of an individual cavity is reduced. Evidently, the provision of the more precise solder mask is more expensive. Now, the packages of the present invention differ from conventional QFN packages in that more than a single row of terminals is present. Additionally, the terminals are defined at a distance from the encapsulation (stand-off). The terminals of a conventional QFN package are defined in exactly or nearly the same plane as the surface of the encapsulation. It is therefore not clear how to envisage a reliable stencil soldering, while simultaneously fulfilling the requirement of a sufficient density of terminals.

Figure 3:
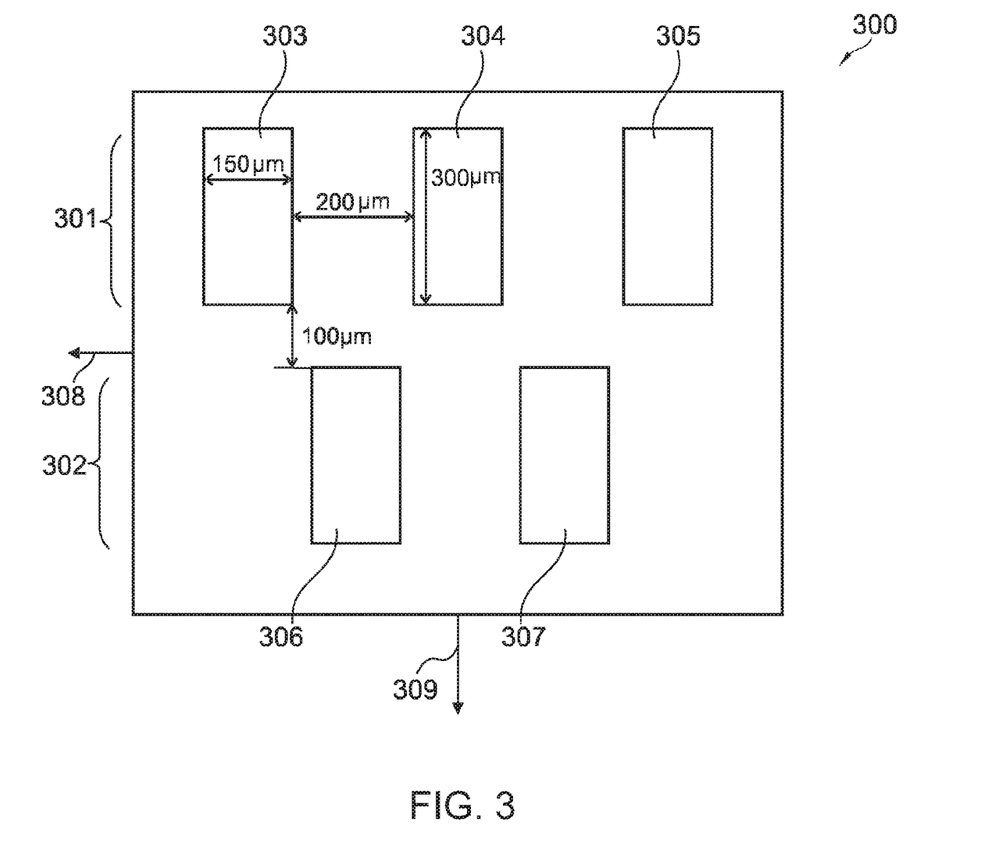
FIG. 3 shows the package of FIG. 1 in a diagrammatical plan view as seen from the side with the exposed terminals.

FIG. 3 is a diagrammatic plan view of the first embodiment, wherein the line A-A indicates the cross-section of FIG. 1. Referring to this Figure, a dual row package 300 according to an exemplary embodiment of the invention will be explained.

The dual row package 300 comprises a first row 301 of terminals and a second row of terminals 302. Each of the rows comprises a plurality of terminals, which are schematically depicted as rectangular terminals 303, 304 and 305 for the first row 301 and as rectangular terminals 306 and 307 of the second row of terminals 302. The shape of the terminals is not square-shaped. That is: it has a first length in a first direction 308 which first direction is substantially parallel to the first row 301. And it has a second length in a second direction 309 which second direction is substantially perpendicular to the first direction 308, 309, and wherein the first length is smaller than the second length.

Suitably, the first, outer row forms a full ring around a die pad terminal. The terminals constitute the exposed surfaces of the contact pads. As explained above, in relation to the technology described with reference to FIGS. 1 and 2, the shape of the contact pads in the first layer need not to be equal to the terminals exposed outside the encapsulation. Furthermore, a first arrow 308 shows a longitudinal axis of the dual row package 300. A second arrow 309 shows a perpendicular direction showing towards a center of the dual row package 300. Thus, the second row 302 may form an inner row of the package. It is not needed that either the first row or the second row constitutes a full row. Particularly, in one suitable embodiment to be explained in more detail subsequently, the second, inner row may 302 have a limited number of terminals only. On a die pad (not-shown) an integrated circuit is provided. Electrical connections are provided between bond pads on the integrated circuit and the contact pads of the package.

According to the invention, a distance between each pair of adjacent terminals in the first row 301 is greater or equal than a first threshold value. A distance between each pair of adjacent terminals in the second row 302 is greater or equal than a second threshold value. A distance between the first row 301 and the second row 302 is smaller than at least the first threshold value. The term 'distance between adjacent terminals' is understood, within the context of the present invention, to refer to the distance between facing edges of the adjacent terminals. The term 'distance between rows' is understood to refer to said same distance that extends in a direction perpendicular to the distance between the adjacent terminals within a single row.

Surprisingly, it has been found that an arrangement of the terminals according to such embodiment reduces the formation of solder bridges in soldering, and in stencil soldering particularly. It has been found that shorts primarily occur between pads of one row and are less probable between pads relating to different rows. Thus, it may be possible to reduce the area necessary to provide a given number of pads by reducing the spacing between rows of pads. Reducing the necessary area, that is the necessary surface, may enable to produce less expensive packages.

This effect is particularly found to be relevant to packages in which the said distance is small, particularly 250 microns or less, preferably 200 microns or less. As shown in the FIG. 3, the layout of the terminals in the first and the second row is mutually staggered. As is generally known in the field, staggered layouts reduce wire-bonding problems and allow size-optimal packages. It is particularly important for designs wherein the first length of the terminal is smaller than the second length. Such a design is beneficial for stencil soldering, as it reduces sticking of the solder paste to the stencil.

While the invention is applicable to all dual row QFN packages, it is of particular importance to such packages manufactured in the technology referred to in FIG. 1 hereafter referred to as UTLP technology. A first reason thereof is that that technology allows the manufacturing of packages with small distances between the terminals. A second reason is that the stand-off of the terminals modifies the solder spreading behaviour. This will be explained in the following:

The formation of solder bridges occurs in the phase during which the solder is most fluid and can best flow. That is evidently during reflow, when the temperature is increased. In order to bridge, the solder needs to find a path between neighbouring terminals around the solder resist mask. When the solder resist mask is applied on the printed circuit board, this path thus lies between the topside of the solder resist mask and the surface of the package. Alternatively, in the less usual case that the solder resist mask is applied on the package surface, the path will be present between the top side of the solder resist mask and the surface of the printed circuit board or any other carrier in use.

Without desiring to be bound therewith, the inventors have made up the following, still provisional explanation for the solder spreading both in conventional QFN packages and the packages made in the UTLP technology. In conventional QFN packages, the solder is believed to find the shortest path between areas that are wetted by solder. The areas that are wetted by solder are essentially the terminals of the package. This shortest path will be along the package surface, i.e. the surface of the encapsulation. The distance between the terminals thus determines the barrier height for solder bridging.

In the UTLP technology, the terminals have a stand-off with respect to the encapsulation. Moreover, underetching of the terminals has taken place during patterning of the second layer of the frame after the encapsulation. As a result, the length of the path along the package surface between neighbouring terminals has increased substantially. Additionally this path crosses different materials: not only the encapsulation material, but also the copper of the second layer, and possibly some Ni of the intermediate layer. The latter will be the case, when the shape of the contact pad (in the first layer of the frame) deviates from the shape of the contact pad. It is therefore unlikely that the solder will flow along the package surface during the formation of solder bridges. Instead, it will use the surface of the solder resist mask. This upper surface of the solder resist mask is however less well defined than the surface of the package. Additionally, the solder resist mask is an organic material, which is generally less rigid than a moulded and chemically crosslinked encapsulation material. For that reason, the solder bridging will much more follow the actual shape of the solder, instead of the shape of the terminals. The effective distance between neighbouring solder dots during reflow is thus the relevant parameter of the solder bridging barrier height.

It goes without saying that the above improvements do not only extend to a dual-row package, but also to multirow-packages and to packages without die pad terminals. Specific examples thereof constitute ball grid array layouts and packages with a uniform terminal layout, such as in itself known from U.S. Pat. No. 6,683,368.

Figure 6:
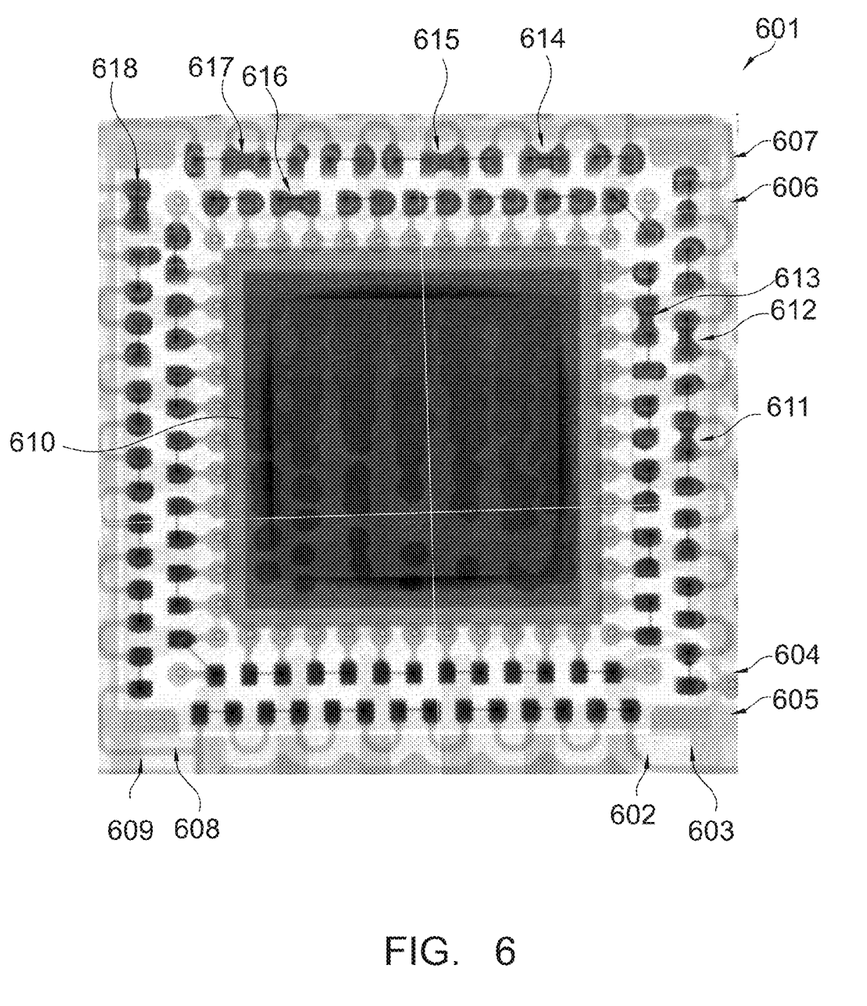
FIG. 6 shows a photograph of a conventional experimental package in which the distances between all pads are equal.

The inventors have come to the insight underlying the present invention on the basis of experiments with packages made in the UTLP technology, in which the distances between all pads were equal. The results of those experiments are shown in FIG. 6, a photograph of a conventional dual row package 601 showing shorts between pads will be shortly explained. The photograph shows a substantially quadratic conventional package 601 having two rows of pads on each side of the quadratic package. On a first side of the package 601 an inner row 602 and an outer row 603 is shown. On a second side of the quadratic conventional package 601 an inner row 604 and an outer row 605 is shown. On a third side of the quadratic conventional package 601 an inner row 606 and an outer row 607 is shown. On a forth side of the quadratic conventional package 601 an inner row 608 and an outer row 609 is shown. In the center of the quadratic conventional package 601 a die pad area 610 is shown onto which the electronic components may be arranged. As already mentioned the spacing between the pads is equal in the direction of the rows and perpendicular to the rows.

On the photograph several shorts can be seen, in particular first short 611, second short 612, third short 613, fourth short 614, fifth short 615, sixth short 616, seventh short 617, and eight short 618. All these shorts arose in such a way that they are connecting two pads of one row, while no short arose which connects two pads belonging to different rows with each other.

A suitable size of the pads of the dual row package 100 in the UTLP technology may be about 150 μm in the first direction 308, i.e. along the rows (first length), and about 300 μm in the second direction 309, i.e. perpendicular to the first direction or towards the center (second length). Spacing between the pads of one row, i.e. in the first direction 308, the so-called pad-pitch may be about 200 μm while the spacing between the two rows, i.e. in the second direction 309, the so-called row-pitch may be about 100 μm. Such a rectangular shape may be in particular advantageous in cases more pads are arranged on the package since due to the rectangular area it may be possible to arrange more pads while still providing enough area for soldering each pad and ensure that the probability of a short between the pads in one row is still low. The dual row package 300 shown in FIG. 3 has a staggered pattern, i.e. the pads 303, 304 and 305 of the first row 303 are shifted along the first direction 308 with respect to the pads 306 and 307 of the second row 302.

Figure 4:
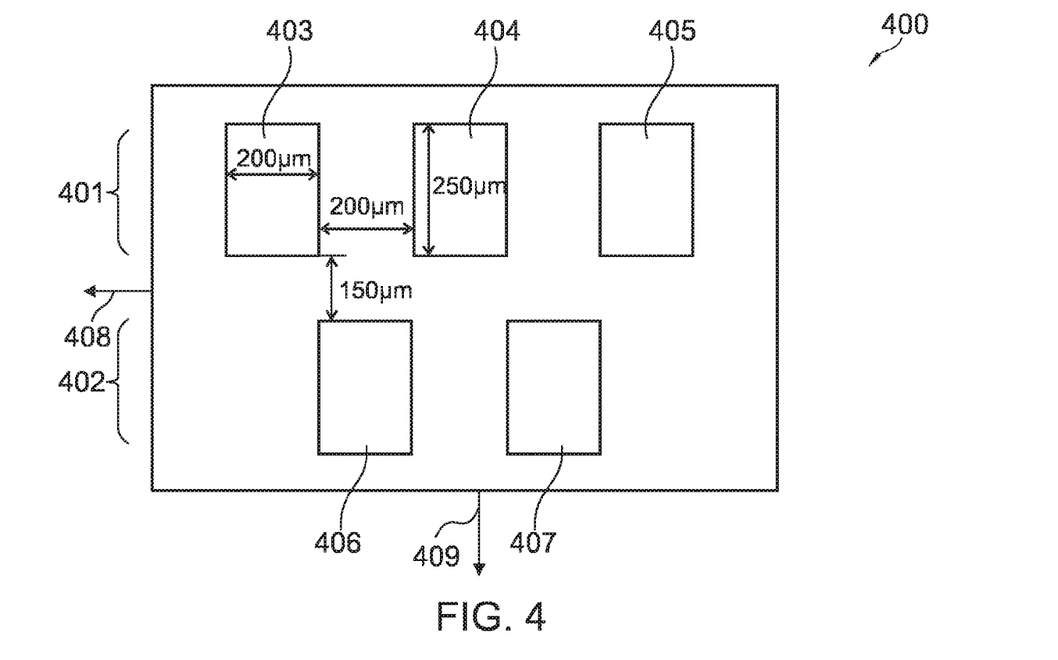
FIG. 4 shows a second embodiment of the package in a view similar to that of FIG. 3.

In the following, referring to FIG. 4, a dual row package 400 according to another exemplary embodiment of the invention will be explained. The dual row package 400 comprises a first row 401 of pads and a second row of pads 404. Each of the rows comprises a plurality of pads, which are schematically depicted as rectangular pads 403, 404 and 405 for the first row 401 and as rectangular pads 406 and 407 of the second row of pads 402. Furthermore, a first arrow 408 shows a longitudinal axis of the dual row package 400 and a perpendicular direction showing towards a center of the dual row package 400 is shown by a second arrow 409. Thus, the second row 402 may form an inner row of the package. Towards the center electronic components may be arranged which use the pads as contacting pads. A suitable size of the pads of the dual row package 400 may be about 400 μm in the first direction 408, i.e. along the rows (width), and about 450 μm in the second direction 409, i.e. perpendicular to the first direction or towards the center (length). Spacing between the pads of one row, i.e. in the first direction 408, the so-called pad-pitch may be about 400 μm while the spacing between the two rows, i.e. in the second direction 409, the so-called row-pitch may be about 150 μm. Such an rectangular shape may be in particular advantageous in cases a larger die is used since due to the larger area of the pads and the increased spacing enough area for soldering each pad may be ensured as well as the probability of a short between the pads in one row is still low.

In connection with the above, it has been found that optimum reliability and compatibility with a large variety of solder materials may be achieved in that the etch mask on the second side of the carrier comprises a solder adhesion layer and a barrier layer against diffusion of material from the solder adhesion layer into the second metal layer of the carrier. Particularly, the solder adhesion layer comprises gold (Au), the second metal layer comprises copper or a copper alloy (Cu) and the barrier layer comprises palladium (Pd). The presence of such barrier layer is particularly relevant for small sized terminals, such as present when the distance between the terminals is less than 450 microns (pitches between the centers of the terminals of less than 500 microns). Apparently, the heating steps during manufacture or use of the package, accelerate diffusion of the solder adhesion layer into the second metal layer. Then there is insufficient material left for forming a reliable and stable connection with the solder. Evidently, the above mentioned is also dependent on the thickness of the applied layers.

In the following several embodiments will be elaborated relating to design and application features enabled by the use of the UTLP technology, as compared to conventional QFN packages. There is however no intention to limit the following to the specific construction and manufacturing of the UTLP technology, and the same may be relevant for similar technologies.

Many of these improvements have been found along the lines and limitations of an application wherein the package is connected to a printed circuit board with stencil soldering, and wherein there is a need to provide a miniaturized package. The provision of dual- or multirow packages with a high density of terminals generally has an important consequence for the design of the printed circuit board: vias are needed at the area below the package. These vias turn out to constitute sensitive areas for soldering. In particular, it has been found that a via below a terminal or a die pad leads to failure, due to interaction with the solder.

In a first improvement, the terminal under the die pad is given a smaller size than the die pad itself. In addition thereto, a via is defined in the area underlying the die pad but adjacent to the terminal. In this manner, there is no area lost in the package or in the printed circuit board for the definition of a via. Nevertheless, the via is reliable, since it is not defined below a terminal. The via referred to in this embodiment is advantageously a via for a terminal adjacent to the die pad. An interconnect will be defined at the surface of the printed circuit board between the via and the contact pad aligned with the terminal. This interconnect is covered with solder resist. Negative impact due to capacitive coupling between the die pad and the interconnect and via is not found. The distance between die pad (in the first metal layer of the carrier) and the interconnect is sufficiently large. This improvement may be combined with a subdivision of the terminal under the die pad into a plurality of smaller terminals. Such subdivision is effectively common practice for stencil soldering of QFN packages; usually the solder resist mask defines the subdivision.

In a second improvement not merely the terminal under the die pad is given a modified shape, but the shape of the complete die pad is modified. Particularly, the die pad is designed to have a circular or oval shape. Such an improvement again allows the definition of vias in an area otherwise lost. Additionally, this enables the definition of terminals at an area underlying the chip. Such terminals can be connected to a contact pads adjacent to the die or underlying the die. This is a matter of design, further depending on the use of electrically conductive or insulating adhesive. This shape of the die pad does not reduce the connection of the die pad terminal to a printed circuit board. Solder has anyway the tendency to form a sphere, and thus the corners of a die pad tend to be areas that do not contribute. This shape of the die pad further improves reliability due to the reduction of perimeter/circumference length. This is relevant for reliability, as delamination inside a package with a die pad usually starts at the edge of the die pad. This is also the area that is most sensitive to stress resulting from thermal cycling. It is observed for clarity that the UTLP technology enables the provision of such non-square and preferably circular or oval die pad. In conventional QFN and QFP technology, tie bars are needed to establish mechanical integrity of the package prior to the provision of the encapsulation. In combination with such a circular or oval shape of the die pads, the terminal below the die pad may nevertheless be subdivided.

In a third embodiment, the inner row 302 is merely used for pads that do not need specific or separate connections. Specifically, the inner row comprises test pads, while the contact pads are defined in the outer row. It is then not necessary to apply a full inner row. In such a case, however, the number of test pads may be extended so as to enable to do certain tests in parallel, and thus to reduce the time needed for testing. The term 'test pad' herein specifically refers to pads used for testing, but also includes pads used for preprogramming of the chip in the package, and pads used for a initial read out of certain security features. An example hereof is for instance an element defined as a physically unclonable function (PUF). It is added for clarity that this does not exclude the presence of test pads in the outer row as well.

It is observed that the definition of test contact pads, without corresponding test terminals might be sufficient. This option is particularly given within the UTLP technology, in which such contact pads are exposed from the package if the corresponding terminals are absent. The ability to do this further depends on the probes or other instruments used during the testing, and their ability to contact an interface of the barrier layer material, which is for instance Ni.

In particular, the pads used as test-pads may have an internal pulldown to electrical ground and may be placed close to a die-pad. In this case, a short of the test-pad to the die-pad or to another test-pad by an artifact during soldering, for example, may not cause problems, since the die-pad and/or the other test-pads are also connected to electrical ground. In particular, in case that for a given application only a simple printed circuit board (PCB), i.e. a PCB having only one row of connecting pads, are necessary the test-pads are put on the inner row of the package, which may lead to the fact that the dual row package may be used as a single row package. In that case, the size of the test-pads may be reduced to the size required to place a test-probe during final testing.

The invention claimed is:

1. A dual or multiple row package comprising an encapsulation around a chip, and a first plurality of terminals and a second plurality of terminals, which first and second plurality of terminals are exposed outside the encapsulation at a first side of the package,
    wherein the terminals of the first plurality of terminals are arranged in a first row, wherein a distance between each pair of adjacent terminals in the first row is greater than or equal to a first threshold value;
    wherein the terminals of the second plurality of terminals are arranged in a second row, wherein a distance between each pair of adjacent terminals in the second row is greater than or equal to a second threshold; and
    wherein a distance between the first row and the second row is smaller than at least the first threshold value.

2. The package as claimed in claim 1, wherein at least one of the terminals has a substantially rectangular shape and a first length in a first direction which first direction is substantially parallel to the first row and a second length in a second direction which second direction is substantially perpendicular to the first direction, and wherein the first length is smaller than the second length.

3. The package as claimed in claim 1, wherein the terminals are defined at a stand-off distance from the surface of the encapsulation.

4. The package of claim 1, wherein each of the terminals is mechanically connected to a contact pad which is mechanically anchored within the encapsulation.

5. The package of claim 4, wherein at least part of the terminals is connected to a contact pad with a two-dimensional shape differing from the shape of the terminal.

6. The package of claim 5, wherein the contact pads of the terminals in the outer row are arranged in a circular, oval or octagonal ring, whereas the terminals are arranged along the four edges of the package.

7. The package of claim 1, wherein at least part of the terminals of the first row are staggered with respect to the terminals of the second row.

8. The package of claim 1, wherein a die pad with at least one die pad terminal is defined at the first side of the package within the first row.

9. The package of claim 1, wherein the terminals are defined in a ball grid array layout.

10. The package of claim 4, wherein the package comprises further features that are mechanically anchored in the encapsulation alike the contact pads, but are defined partially or completely without corresponding terminals.

11. The package of claim 10, wherein one further feature is an additional pad for use as a wire bonding island.

12. The package of claim 11, wherein the wire bonding island is a power pad with a size larger than a contact pad and a plurality of wire bonds extend from the island to the chip.

13. The package of claim 12, wherein the power pad has a terminal in the first row.

14. The package of claim 10, wherein one further feature is a coil configuration.

15. The package of claim 1, wherein at least one terminal of the first plurality of terminals is adapted to be used as a test-pad.

16. A dual or multiple row package comprising an encapsulation around a chip, the chip being attached to a die pad, the package having least one contact pad and a first row of terminals, which terminals are exposed outside the encapsulation at a first side of the package, characterized in that the package further comprises test pads that are defined between the first row of terminals and the contact pad.

17. The package of claim 16, wherein the test pads are provided with terminals, and wherein all terminals have a stand-off from a surface of the encapsulation.

18. The package of claim 1, wherein the package is soldered to a carrier.

19. The package of claim 16, wherein test probes are coupled to the test pads.

* * * * *